(12) United States Patent
Schulze et al.

(10) Patent No.: US 11,081,544 B2
(45) Date of Patent: Aug. 3, 2021

(54) METHOD OF MANUFACTURING A SEMICONDUCTOR DEVICE COMPRISING FIRST AND SECOND FIELD STOP ZONE PORTIONS

(71) Applicant: Infineon Technologies AG, Neubiberg (DE)

(72) Inventors: Hans-Joachim Schulze, Taufkirchen (DE); Franz-Josef Niedernostheide, Hagen (DE); Oana Julia Spulber, Neubiberg (DE); Stephan Voss, Munich (DE)

(73) Assignee: Infineon Technologies AG, Neubiberg (DE)

( * ) Notice: Subject to any disclaimer, the term of this patent is extended or adjusted under 35 U.S.C. 154(b) by 233 days.

(21) Appl. No.: 16/202,752

(22) Filed: Nov. 28, 2018

(65) Prior Publication Data

US 2019/0165090 A1 May 30, 2019

(30) Foreign Application Priority Data

Nov. 29, 2017 (DE) .......................... 102017128247.5

(51) Int. Cl.
*H01L 29/06* (2006.01)
*H01L 21/265* (2006.01)
(Continued)

(52) U.S. Cl.
CPC .... *H01L 29/0615* (2013.01); *H01L 21/26513* (2013.01); *H01L 21/324* (2013.01); *H01L 29/1095* (2013.01); *H01L 29/36* (2013.01); *H01L 29/6609* (2013.01); *H01L 29/66333* (2013.01); *H01L 29/167* (2013.01); *H01L 29/861* (2013.01)

(58) Field of Classification Search
CPC . H01L 29/0615; H01L 29/1095; H01L 29/36; H01L 29/6609; H01L 66/333; H01L 21/26513; H01L 21/324
See application file for complete search history.

(56) References Cited

U.S. PATENT DOCUMENTS

| 2015/0069462 A1* | 3/2015 | Mizushima | ............. H01L 29/36 |
| | | | 257/139 |
| 2016/0284825 A1* | 9/2016 | Onozawa | ............. H01L 29/1095 |
| 2017/0117384 A1* | 4/2017 | Lee | ..................... H01L 29/0611 |

FOREIGN PATENT DOCUMENTS

WO 2017047285 A1 3/2017

* cited by examiner

*Primary Examiner* — Zandra V Smith
*Assistant Examiner* — Abbigale A Boyle
(74) *Attorney, Agent, or Firm* — Murphy, Bilak & Homiller, PLLC

(57) ABSTRACT

A method of manufacturing a device in a semiconductor body includes forming a first field stop zone portion of a first conductivity type and a drift zone of the first conductivity type on the first field stop zone portion. An average doping concentration of the drift zone is smaller than 80% of that of the first field stop zone portion. The semiconductor body is processed at a first surface and thinned by removing material from a second surface. A second field stop zone portion of the first conductivity type is formed by implanting protons at one or more energies through the second surface. A deepest end-of-range peak of the protons is set in the first field stop zone portion at a vertical distance to a transition between the drift zone and first field stop zone portion in a range from 3 μm to 60 μm. The semiconductor body is annealed.

24 Claims, 10 Drawing Sheets

(51) Int. Cl.
*H01L 29/66* (2006.01)
*H01L 29/10* (2006.01)
*H01L 21/324* (2006.01)
*H01L 29/36* (2006.01)
*H01L 29/167* (2006.01)
*H01L 29/861* (2006.01)

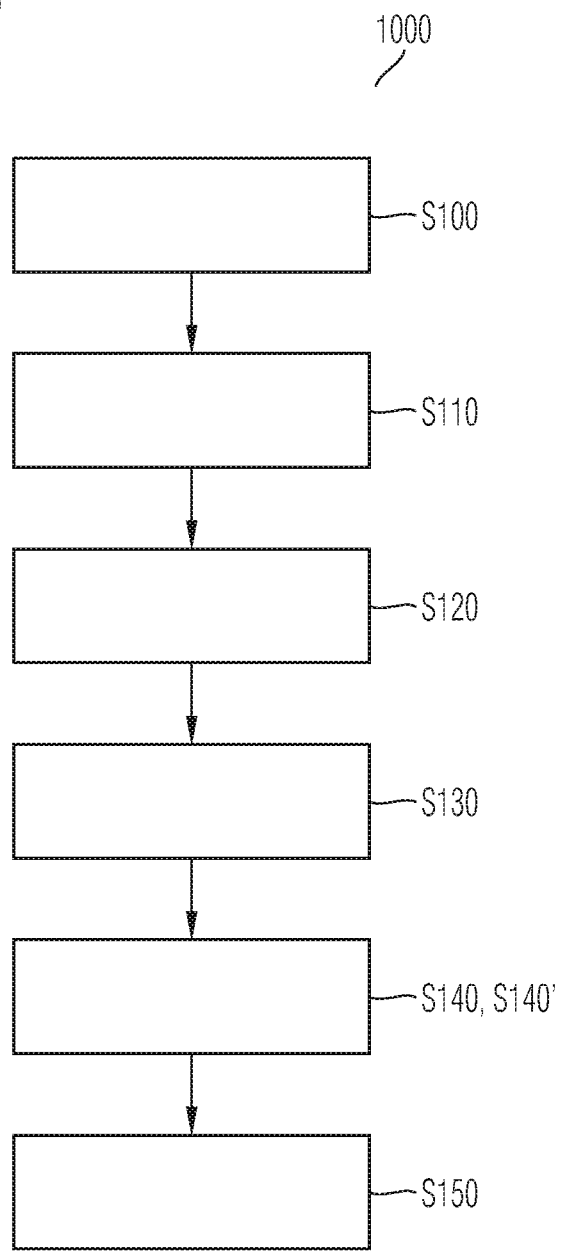

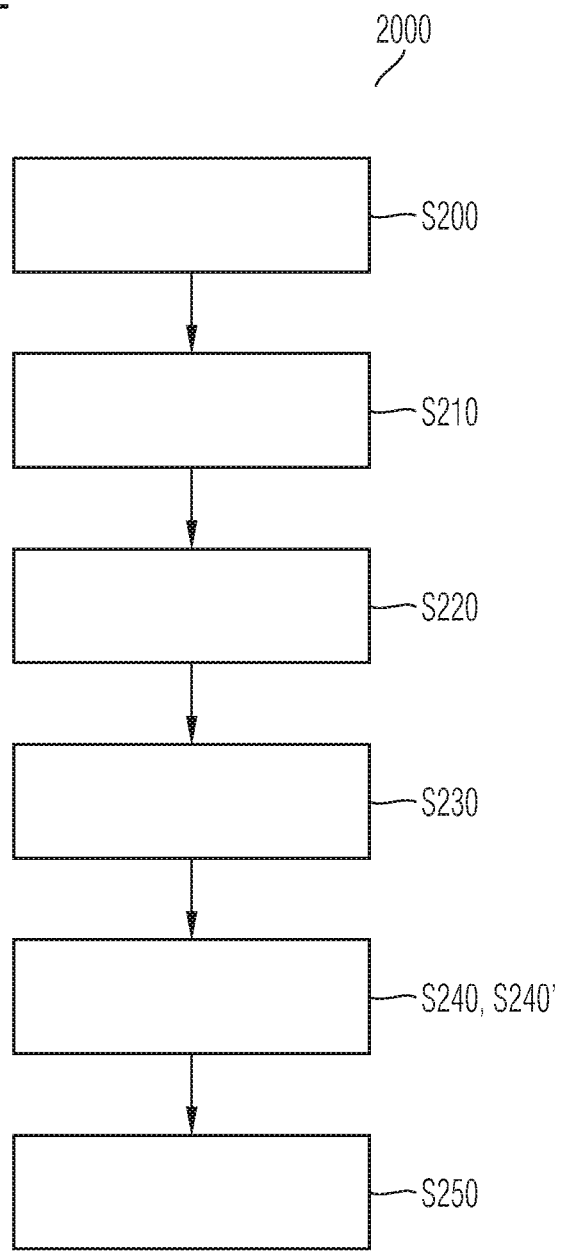

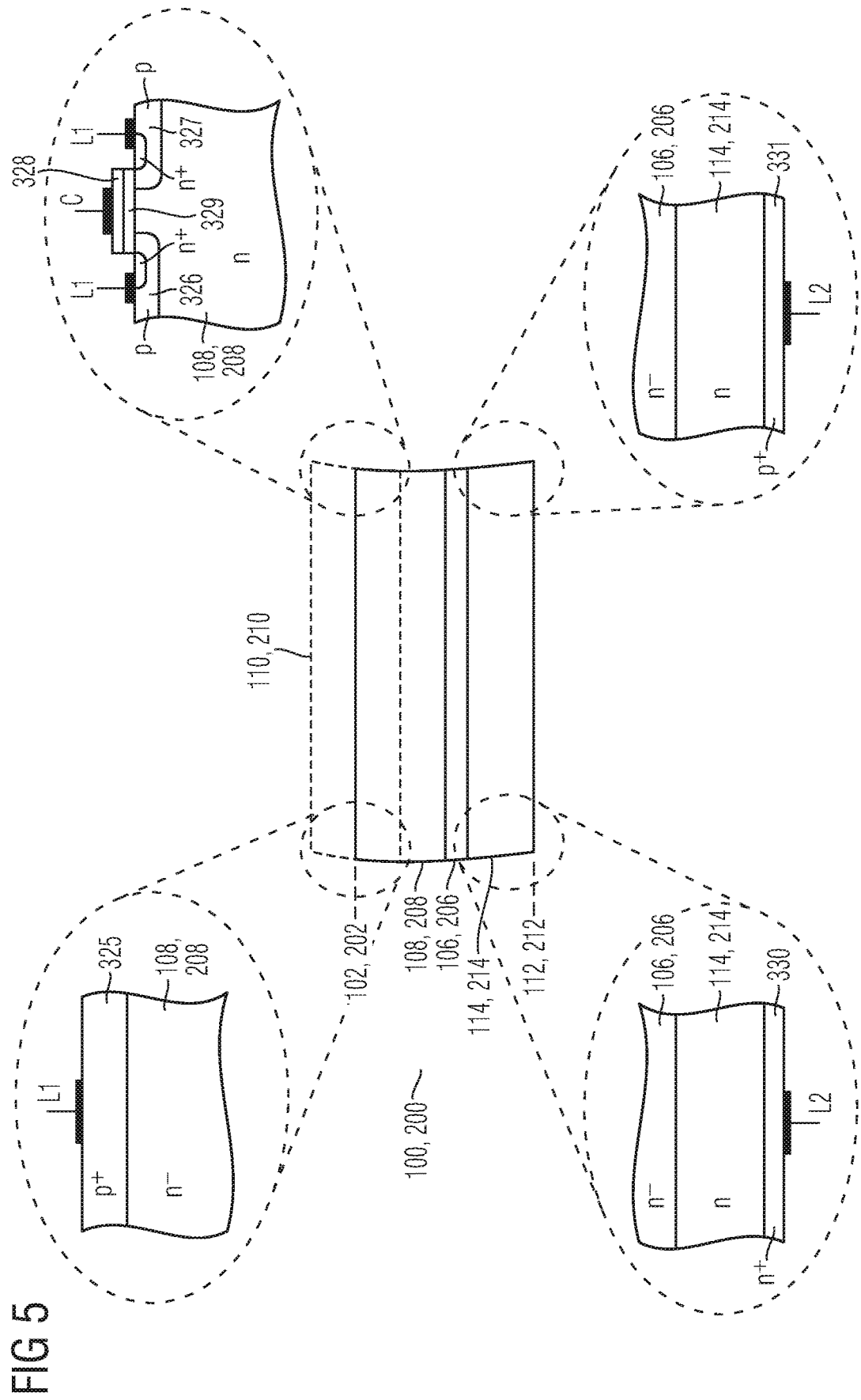

METHOD OF MANUFACTURING A SEMICONDUCTOR DEVICE COMPRISING FIRST AND SECOND FIELD STOP ZONE PORTIONS

BACKGROUND

Semiconductor devices, for example insulated gate bipolar transistor (IGBTs) or diodes are designed to meet a variety of demands, for example regarding operation losses, short circuit robustness, blocking voltage, oscillation behavior during turn-off, cosmic ray robustness or stability of rear side partial transistor amplification factor $\alpha_{pnp}$ of IGBTs. When improving certain device characteristics by adjusting specific layout parameters, this may lead to a negative impact on other device characteristics. Thus, semiconductor device design may require a trade-off between demands on different device characteristics.

It is thus desirable to improve a method of manufacturing an insulated gate bipolar transistor semiconductor comprising a field stop zone that allows for an improved trade-off between device characteristics.

SUMMARY

The present disclosure relates to a method of manufacturing a semiconductor device in a semiconductor body comprising forming a first field stop zone portion of a first conductivity type on a semiconductor substrate. A drift zone of the first conductivity type is formed on the first field stop zone portion. An average doping concentration of the drift zone is set smaller than 80% of an average doping concentration of the first field stop zone portion. The semiconductor body is processed at a first surface of the semiconductor body. The semiconductor body is thinned by removing material of the semiconductor substrate from a second surface of the semiconductor body opposite to the first surface. A second field stop zone portion of the first conductivity type is formed by implanting protons at one or more energies into the semiconductor body through the second surface. A deepest end-of-range peak of the protons is set in the first field stop zone portion at a vertical distance to a transition between the drift zone and the first field stop zone portion in a range from 3 µm to 60 µm. The semiconductor body is annealed by thermal processing.

The present disclosure relates to another method of manufacturing a semiconductor device in a semiconductor body comprising forming a drift zone of a first conductivity type on a semiconductor substrate. The semiconductor body is processed at a first surface of the semiconductor body. The semiconductor body is thinned by removing material of the semiconductor substrate from a second surface of the semiconductor body opposite to the first surface. A first field stop zone portion of the first conductivity type is formed between the second surface and the drift zone by implanting protons into the semiconductor body through the second surface and setting a vertical distance between an end-of-range peak of the protons and the second surface in a range from 5 µm to 70 µm. An average doping concentration of the first field stop zone portion is set greater than 120% of an average doping concentration of the drift zone. A second field stop zone portion of the first conductivity type is formed by implanting protons at one or more energies into the semiconductor body through the second surface. A deepest end-of-range peak of the protons is set in the first field stop zone portion at a vertical distance to a transition between the drift zone and the first field stop zone portion in a range from 3 µm to 60 µm. The semiconductor body is annealed by thermal processing.

In one or more embodiments, the second field stop zone may also be formed by introducing dopants of the first conductivity type into the semiconductor body through the second surface, wherein the dopants are deep-level dopants.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments and together with the description serve to explain principles of the invention. Other embodiments of the invention and intended advantages will be readily appreciated as they become better understood by reference to the following detailed description.

FIG. 1 is a flow-chart illustrating an example of manufacturing a semiconductor device.

FIG. 2 is a flow-chart illustrating another example of manufacturing a semiconductor device.

FIG. 5 is a schematic cross-sectional view of a semiconductor body for illustrating examples of semiconductor devices including first and second field stop zone portions.

DETAILED DESCRIPTION

Figure 3A:
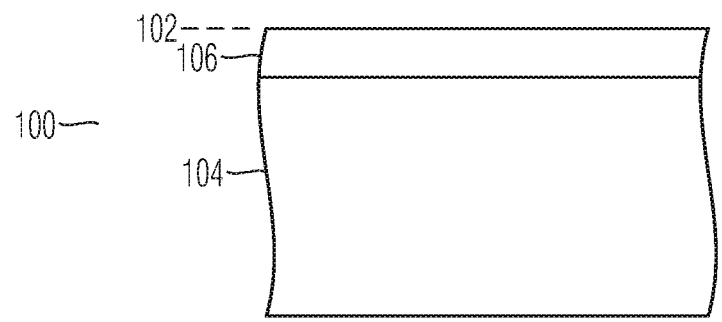
FIG. 3A is a schematic cross-sectional view of a semiconductor body for illustrating a process of manufacturing a semiconductor device by forming a first field stop zone portion on a semiconductor substrate.

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "$n^−$" means a doping concentration that is lower than the doping concentration of an "n"-doping region while an "$n^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside surface while the first surface is considered to be formed by the upper, front or main surface of the semiconductor substrate. The terms "above" and "below" as used in this specification therefore describe a relative location of a structural feature to another.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped.

FIG. 1 is a schematic flow-chart for illustrating a method 1000 of manufacturing a semiconductor device in a semiconductor body, for example a power semiconductor device such as a power insulated gate bipolar transistor (power IGBT) or a power diode.

It will be appreciated that while method 1000 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases.

Referring to FIG. 1, process feature S100 comprises forming a first field stop zone portion of a first conductivity type on a semiconductor substrate. In one or more embodiments, the semiconductor body is a silicon semiconductor body, for example a silicon semiconductor substrate such as a silicon (Si) semiconductor wafer. The semiconductor wafer may be a wafer of any size, for example a Czochralski (CZ) wafer such as a standard CZ and a magnetic CZ (MCZ) wafer or a Float Zone (FZ) wafer of 8 inch (200 mm), 12 inch (300 mm) or 18 inch (450 mm). The semiconductor body may include none, one or even more semiconductor layers on top of the semiconductor substrate prior to formation of the first field stop zone portion. Other substrate materials than silicon, for example silicon carbide (SiC), gallium arsenide (GaAs), gallium nitride (GaN) or other $A_{III}B_V$ compound semiconductors, germanium (Ge) or silicon germanium (SiGe) may alternatively be used as substrate material. In one or more embodiments, a highly doped semiconductor layer configured to act as a rear side emitter layer may be formed on top of the semiconductor substrate, for example. The first field stop zone portion may be formed by an epitaxial layer growth process, for example gas phase epitaxy, liquid phase epitaxy (LPE), molecular beam epitaxy (MBE) or chemical vapor deposition (CVD) may be used to increase the thickness of the semiconductor body. In one or more embodiments, in-situ doping during the layer growth process may be used to completely, predominantly or partly set a target doping profile in the first field stop zone portion. The doping concentration profile set by in-situ doping may be constant or almost constant, or may slightly decrease with increasing thickness of growth. One or more optional doping processes, for example diffusion and/or ion implantation processes may follow to set or alter the doping profile in the first field stop zone portion.

Referring to FIG. 1, process feature S110 comprises forming a drift zone of the first conductivity type on the first field stop zone portion, wherein an average doping concentration of the drift zone is set smaller than 80% of an average doping concentration of the first field stop zone portion. The average doping concentration of the drift zone may be determined by averaging the doping concentration along a vertical extension of the drift zone, for example along a vertical extension of an IGBT drift zone between a body region and the first field stop zone portion or along a vertical extension of an diode drift zone between an anode region and a the first field stop zone portion. The average doping concentration of the first field stop zone portion may be determined by averaging the doping concentration along a vertical extension of the first field stop zone portion, for example along a vertical extension of the first field stop zone portion between an end of the drift zone where an increase of doping concentration occurs at a transition to the first field stop zone portion and a further increase of doping concentration at a transition between the first field stop zone portion and a second field stop zone portion or an emitter or drain region. In one or more embodiments, the vertical extension of the drift zone may be in a range of 20 µm to 700 µm and an average doping concentration of the drift zone may be in a range from $5 \times 10^{12}$ cm$^{-3}$ to $2 \times 10^{14}$ cm$^{-3}$, or in a range from $1 \times 10^{13}$ cm$^{-3}$ to $1 \times 10^{14}$ cm$^{-3}$, configured to realize a drift zone of a vertical power IGBT or vertical power diode of more than 1 A rated maximum load current and a rated load terminal to load terminal breakdown voltage larger than 300V, or larger than 400V, or larger than 600V, or larger than 650V, or larger than 900V, or larger than 1000V, or larger than 1200V, or larger than 1600V, or larger than 1700V, or larger than 3300V, or larger than 4500V, for example 6500V.

Referring to FIG. 1, process feature S120 comprises processing the semiconductor body at a first surface of the semiconductor body. Processing the semiconductor body at the first surface may include processes for forming doped semiconductor regions, for example masked or unmasked doping processes, for example ion implantation and/or diffusion processes for forming body regions, source regions, highly doped body contact regions, channel implant regions of transistors such as IGBTs, anode or cathode regions of diodes, edge termination structures such as variation of lateral doping (VLD) regions or junction termination extension (JTE) regions, guard rings, channel stoppers. Processing the semiconductor body at the first surface may further include processes for forming insulating regions, for example thermal oxidation processes, thermal nitridation processes, dielectric layer deposition processes such as chemical vapor deposition (CVD), low-pressure chemical vapor deposition (LPCVD), plasma enhanced chemical vapor deposition (PEPCVD), atmospheric pressure chemical vapor deposition (APCVD), sub-atmospheric pressure chemical vapor deposition (SACVD) and high density plasma chemical vapor deposition (HDP CVD). Exemplary insulating regions are gate insulating layers, for example thermal oxides or nitrides or high-k and low-k dielectrics, field insulating layers, for example field oxide layers, insulating interlayers, for example deposited oxides such as tetraethyl orthosilicate glass (TEOS), borophosphosilicate glass (BPSG), borosilicate glass (BSG), phosphosilicate glass (PSG), device insulating layers, for example local oxidation of silicon (LOCOS) or trench insulations. Processing the semiconductor body at the first surface may further include processes for forming conductive regions, for example physical vapor deposition (PVD) of materials such as metals and metal compounds, chemical vapor deposition (CVD) of materials such as doped polycrystalline silicon or tungsten and electro-chemical deposition (ECD) of materials such as copper. Exemplary conductive regions are gate electrodes, conducting paths of wiring levels, bond pads, vias and contacts. Processing the semiconductor body at the first surface may further include processes for removing material from the first surface, for example etch processes or abrasive machining such as grinding or polishing, and chemical-mechanical polishing (CMP). Exemplary structures resulting from material removal are trenches, for example gate trenches, or field trenches or trenches of trench isolations, contact holes.

Referring to FIG. 1, process feature S130 comprises thinning the semiconductor body by removing material of the semiconductor substrate from a second surface of the semiconductor body opposite to the first surface. In one or more embodiments, the semiconductor body is mechanically supported by a carrier attached to the first surface. Material of the semiconductor substrate may be removed by chemical processes, for example by etching such as dry or wet etching, mechanical processes, for example abrasive machining such as grinding or polishing, and chemical-mechanical processes such as chemical-mechanical polishing (CMP. In one or more embodiments, a combination of more than one process for removing material of the semiconductor substrate may be used, for example a first process having a greater material removal rate than a second process following the first process. This may allow for a fine-adjustment of a target wafer thickness, for example. The process for removing material of the semiconductor substrate from the second surface may also include the so-called TAIKO process. The TAIKO process is a wafer thinning process in which an outer support ring along the edge of the wafer is not thinned during the thinning process. The outer support ring may provide improved thin wafer handling during subsequent processing. For example, wafers that are thinned using the TAIKO process can typically maintain their rigidity without being attached to an additional carrier.

Referring to FIG. 1, process feature S140 comprises forming a second field stop zone portion of the first conductivity type by implanting protons at one or more energies into the semiconductor body through the second surface. A deepest end-of-range peak of the protons is set in the first field stop zone portion at a vertical distance to a transition between the drift zone and the first field stop zone portion in a range from 3 µm to 60 µm. The one or more proton implantations may be coordinated to set a combination of characteristics of the second field stop zone portion, for example doping concentration gradient, vertical extension, doping concentration. In one or more embodiments, a doping concentration of the second field stop zone portion is set high enough in IGBTs to enable effective charge compensation of an electron current flow to a rear side emitter caused by cosmic ray absorption. A minimum doping concentration of the second field stop zone portion may set larger than $2 \times 10^{15}$ cm$^{-3}$ donors in IGBTs having an n-type drift zone, or larger than $1 \times 10^{16}$ cm$^{-3}$ donors, or even larger than $5 \times 10^{16}$ cm$^{-3}$ donors. In one or more embodiments, a doping concentration gradient of a decrease in doping concentration in the second field stop zone portion may be set in an appropriate way to expand a space charge region during disturbance by cosmic ray absorption such that an electric field peak in a rear side portion close to a rear side emitter is kept low or at a minimum. In one or more embodiments, a vertical extension of a part of the second field stop zone portion electrically compensating high electron densities caused by cosmic ray absorption, for example a part of the second field stop zone portion between the first field stop zone portion and a peak concentration of the second field stop zone portion may be larger than 1 µm, or even larger than 3 µm.

Referring to FIG. 1, process feature S140', which may replace process feature S140 in some embodiments, comprises forming a second field stop zone portion of the first conductivity type by introducing dopants of the first conductivity type into the semiconductor body through the second surface, wherein the dopants are deep-level dopants. The deep-level dopants may be introduced by ion implantation or diffusion, for example. Other than shallow dopants such as boron (B) or phosphorus (P) in silicon, deep-level dopants require energies larger than the thermal energy to ionize so that only a fraction of the deep-level dopants that are present in the semiconductor body contribute to free carriers. At room temperature, for example 25° C., the deep-level dopants may be more than three or more than five times the thermal energy away from either band edge, for example. The deep-level dopants may be selenium, for example.

Referring to FIG. 1, process feature S150 comprises annealing the semiconductor body by thermal processing. This may enable activation of hydrogen related donors or deep-level dopants. In one or more embodiments, annealing temperatures may be set in a range of 300° C. and 500° C., or in a range of 350° C. and 450° C., or in a range of 360° C. and 440° C., or even in a range of 380° C. and 420° C. In one or more embodiments, annealing may be carried out for a period between 10 minutes and 10 hours, or a period between 20 minutes and 5 hours, or for a period between 30 minutes to 2 hours. During the annealing process complex formation of hydrogen related donors by protons and crystal defects, for example vacancies introduced by proton irradiation occurs.

In one or more embodiments, thinning the semiconductor body is terminated at a vertical distance to a transition between the drift zone and the first field stop zone portion in a range from 5 μm to 70 μm. At the transition between the drift zone and the first field stop zone portion, the doping concentration increases from a lower level in the drift zone to a higher level in the first field stop zone portion, for example.

In one or more embodiments, the first field stop zone portion and the drift zone are formed by an epitaxial layer formation process, for example by chemical vapor deposition (CVD).

FIG. 2 is a schematic flow-chart for illustrating a method 2000 of manufacturing a semiconductor device in a semiconductor body.

It will be appreciated that while method 2000 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases.

Referring to FIG. 2, process feature S200 comprises forming a drift zone of a first conductivity type on a semiconductor substrate. Details provided with reference to formation of the drift zone by process feature S110 of the method 1000 illustrated in FIG. 1 apply accordingly.

Referring to FIG. 2, process feature S210 comprises processing the semiconductor body at a first surface of the semiconductor body. Details provided with reference to formation of the drift zone by process feature S120 of the method 1000 illustrated in FIG. 1 apply accordingly.

Referring to FIG. 2, process feature S220 comprises thinning the semiconductor body by removing material of the semiconductor substrate from a second surface of the semiconductor body opposite to the first surface. Details provided with reference to formation of the drift zone by process feature S130 of the method 1000 illustrated in FIG. 1 apply accordingly.

Referring to FIG. 2, process feature S230 comprises forming a first field stop zone portion of the first conductivity type between the second surface and the drift zone by implanting protons into the semiconductor body through the second surface and setting a vertical distance between an end-of-range peak of the protons and the second surface in a range from 8 μm to 70 μm. Process feature S230 further comprises setting an average doping concentration of the first field stop zone portion greater than 120% of an average doping concentration of the drift zone. A typical profile shape of the hydrogen-related donor profiles is closely correlated to an initial damage profile of the radiation-induced lattice defects. The profiles, hence, typically exhibit an extended penetrated range with an approximately constant concentration followed by an expressed peak, i.e. the end of range peak near the end-of-range of the protons.

Referring to FIG. 2, process feature S240 comprises forming a second field stop zone portion of the first conductivity type by implanting protons at different energies into the semiconductor body through the second surface. A deepest end-of-range peak of the protons is set in the first field stop zone portion at a vertical distance to a transition between the drift zone and the first field stop zone portion in a range from 3 μm to 60 μm. Details provided with reference to formation of the second field stop zone portion by process feature S140 of the method 1000 illustrated in FIG. 1 apply accordingly.

Referring to FIG. 2, process feature S240', which may replace process feature S240 in some embodiments, comprises forming a second field stop zone portion of the first conductivity type by introducing dopants of the first conductivity type into the semiconductor body through the second surface, wherein the dopants are deep-level dopants. Details provided with reference to formation of the second field stop zone portion by process feature S140' of the method 1000 illustrated in FIG. 1 apply accordingly.

Referring to FIG. 2, process feature S250 annealing the semiconductor body by thermal processing. Details provided with reference to formation of the second field stop zone portion by process feature S150 of the method 1000 illustrated in FIG. 1 apply accordingly.

In the embodiment of the method 1000 illustrated in FIG. 1, the first field stop zone portion is doped by in-situ doping and, optional, further doping processes such as diffusion and/or ion implantation and activation. In the embodiment of the method 2000 illustrated in FIG. 2, the first field stop zone portion is formed by proton implantation and annealing.

Referring to FIGS. 1 and 2, in one or more embodiments, the first and second field stop zone portions may be formed in one and the same ion implantation equipment, for example in one and the same ion implanter.

Referring to FIGS. 1 and 2, in one or more embodiments, a ratio of an ion implantation energy of the protons of the first field stop zone portion to an ion implantation energy of the protons associated with the deepest end-of-range peak of the second field stop zone portion is set in a range from 2 to 50, or from 5 to 20, for example. This may enable relaxation of the electric field strength during turn-off operation and reduction of oscillation behavior.

Referring to FIGS. 1 and 2, in one or more embodiments, a vertical extension of the second field stop zone portion is set in a range from 1 μm to 15 μm. The vertical extension of the first field stop zone portion may refer to an extension between an end of the drift zone where an increase of doping concentration occurs at a transition to the first field stop zone portion and a further increase of doping concentration at a transition between the first field stop zone portion and the second field stop zone portion.

Referring to FIGS. 1 and 2, in one or more embodiments, the protons for the second field stop zone portion are implanted based on three to ten different ion implantation energies ranging from 200 keV to 700 keV. This may allow for reduction of undulation of a doping profile in a transition region to the first field stop zone portion, leading to a more gradual decrease of the doping profile from the second field stop zone portion to the first field stop zone portion.

Referring to FIGS. 1 and 2, in one or more embodiments, a ratio of a smallest ion implantation energy to a largest ion implantation energy among the three to ten different ion implantation energies used for formation of the second field stop zone portion is set in a range from 50% to 90%. This may be beneficial with regard to reducing an undulation of a doping profile in a transition region to the first field stop zone portion.

Referring to FIGS. 1 and 2, in one or more embodiments, a ratio of an ion implantation dose of proton implantation is set smaller with increasing ion implantation energy among the three to ten different ion implantation energies. This may allow for setting of a more gradual decrease of the doping profile from the second field stop zone portion to the first field stop zone portion.

Referring to FIGS. 1 and 2, in one or more embodiments, an ion implantation dose associated with one of the three to ten different ion implantation energies is set between 3% and 70% of an ion implantation dose associated with another one of the three to ten different implantation energies that is a next larger ion implantation energy to the one of the three to ten different ion implantation energies. This may allow for setting of a more gradual decrease of the doping profile from the second field stop zone portion to the first field stop zone portion.

Referring to FIGS. 1 and 2, in one or more embodiments, annealing temperatures of the thermal processing are set in a range from 360° C. to 440° C. and a duration of the thermal processing is set in a range from 30 minutes to 2 hours.

Methods 1000 and 2000 may allow for an improved smoothing of a doping profile section in a transition region between the second field stop zone portion and the first field stop zone portion. A thermal budget of the annealing process may be set as a function of the proton implantation parameters for the second field stop zone portion, for example as a function of number, energies and doses for improving smoothness of the doping profile of first field stop zone portion in a transition region between the second field stop zone portion and the first field stop zone portion.

Referring to FIGS. 1 and 2, in one or more embodiments, an implantation dose of the protons introduced into the second field stop zone portion is set in a range from $1 \times 10^{13}$ cm$^{-2}$ to $2 \times 10^{15}$ cm$^{-2}$. This may allow for expanding a space charge region during disturbance by cosmic ray absorption such that an electric field peak in a rear side portion close to a rear side emitter of an IGBT is kept low or at a minimum.

Referring to FIGS. 1 and 2, in one or more embodiments, a doping concentration of the drift zone is set in a range from $5 \times 10^{12}$ cm$^{-3}$ to $5 \times 10^{14}$ cm$^{-3}$. This may allow for fabricating high voltage power devices configured to block reverse voltages of some hundreds or thousands of volts.

Referring to FIGS. 1 and 2, in one or more embodiments, a gradient or an average gradient of a dopant concentration profile in the second field stop zone portion is set smaller than $1 \times 10^{21}$ cm$^{-4}$. This may be beneficial with regard to improving turn-off softness behavior.

Referring to FIGS. 1 and 2, in one or more embodiments, q1 equals an integral of an ionized dopant charge along a vertical extension of the first field stop zone portion and q2 equals an integral of an ionized dopant charge along a vertical extension of the second field stop zone portion, and a doping concentration profile of the first and second first field stop zone portions is adjusted to set a ratio of q2 to q1 in a range from 1 to 8. In one or more embodiments, q1 is set smaller than a breakdown charge of the semiconductor body. The charge q1 may be set smaller than 80% of a breakdown charge of the semiconductor body, or smaller than 60% of a breakdown charge of the semiconductor body, or even smaller than 40% of a breakdown charge of the semiconductor body. In one or more embodiments, a sum of q1 and q2 may be set larger than breakdown charge of the semiconductor body for the purpose of improving cosmic ray robustness, for example.

By combining the first and second field stop zones, a desired voltage blocking capability and turn-off softness may be achieved. Moreover, formation of the first and second field stop zone portions further allows for an isolated adjustment of voltage blocking behavior that is, inter alia, based on characteristics of the drift zone and the first field stop zone portion, and rear side emitter efficiency that is, inter alia, based on the doping profile in the second field stop zone portion. Thus, thickness variations caused by process technology of thinning of the semiconductor body may still lead to acceptable variations of short circuit robustness.

In one or more embodiments, the semiconductor device is a diode, and processing the semiconductor body at the first surface includes forming a p-doped anode region in the semiconductor body at the first surface. A first load terminal contact, for example an anode terminal contact may be electrically coupled to the semiconductor body at the first surface.

In one or more embodiments, the semiconductor device is a transistor, and processing the semiconductor body at the first surface includes forming a source region and a gate electrode structure at the first surface.

In one or more embodiments, a doping concentration profile of the second field stop zone portion includes a plurality of peaks, and the doping concentration profile is set to decrease, along a vertical direction toward the second surface, from a maximum to a neighboring minimum by less than 50% of a concentration value at the maximum. With decreasing distance between neighboring doping peaks, overlap of the doping profiles of the neighboring doping peaks increases, thereby leading to a more uniform increase of the doping concentration of field stop zone toward the second surface, for example.

In one or more embodiments, the method 1000 or the method 2000 further comprises introducing dopants of the first conductivity type into the semiconductor body through the second surface, wherein the dopants are deep-level dopants. In one or more embodiments, the dopants are introduced by ion implantation and are activated by laser annealing, for example. This may allow for improving a temperature characteristic of the turn-off softness or a high temperature leakage current behavior. In one or more embodiments, the dopants are selenium dopants.

FIGS. 3A to 3E are cross-sectional views of a semiconductor body for illustrating examples of process features.

The cross-sectional view of FIG. 3A illustrates an example of the process feature of forming a first field stop zone portion 106 of a first conductivity type on a semiconductor substrate 104. Further details provided with reference to process feature S100 illustrated in FIG. 1 apply accordingly.

Figure 3B:
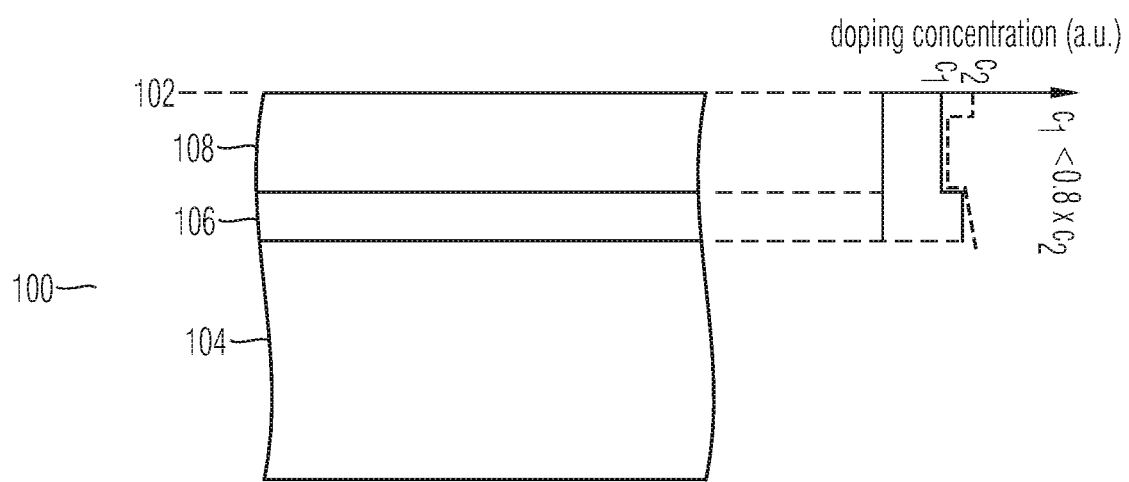
FIG. 3B is a schematic cross-sectional view of the semiconductor body depicted in FIG. 3A after forming a drift zone on the first field stop zone portion.

The cross-sectional view of FIG. 3B illustrates an example of the process feature of forming a drift zone 108 of the first conductivity type on the first field stop zone portion, wherein an average doping concentration of the drift zone 108 is set smaller than 80% of an average doping concentration of the first field stop zone portion 106. Further details provided with reference to process feature S100 illustrated in FIG. 1 apply accordingly. Two exemplary doping profiles in the drift zone 108 and in the first field stop zone portion 106 are illustrated in the right part of FIG. 3B, for example a first profile (solid line) having a constant doping concentration c1 in the drift zone 108 and a constant doping concentration c2 in the first field stop zone portion 106, or a second profile (dashed line) having doping concentration that slightly increases toward the semiconductor substrate 104 in the first field stop zone portion 106, and also increases in a part of the drift zone 106 close to the first surface 102.

Figure 3C:
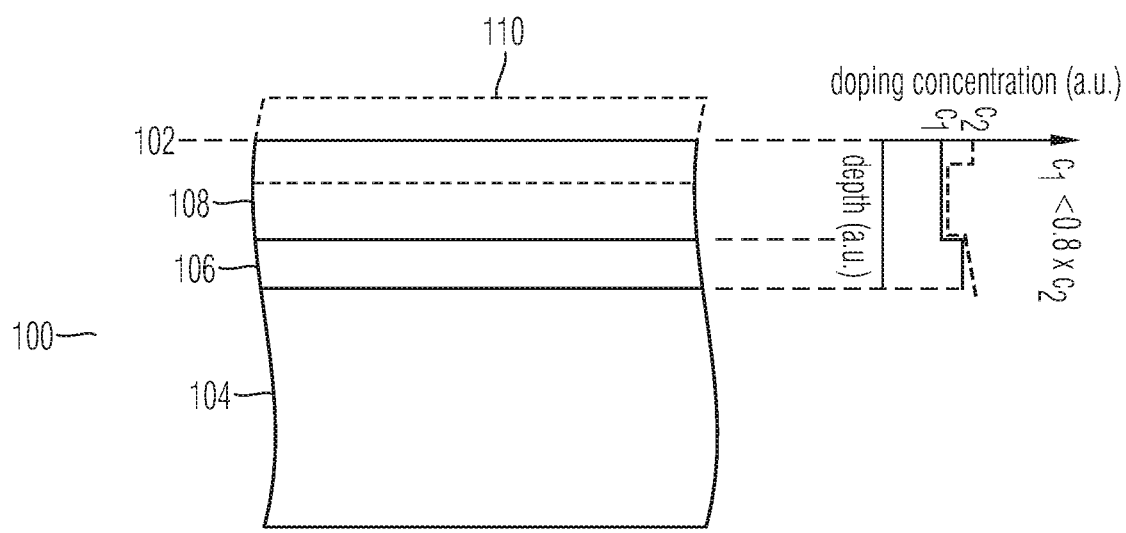
FIG. 3C is a schematic cross-sectional view of the semiconductor body depicted in FIG. 3B after processing the semiconductor body at a first surface of the semiconductor body.

The cross-sectional view of FIG. 3C illustrates an example of processing the semiconductor body at the first surface 102, resulting in a processed portion 110 that may include a part of the semiconductor body 100 adjoining the first surface 102 as well as a wiring area over the semiconductor body 100 at the first surface 102. Further details provided with reference to process feature S120 illustrated in FIG. 1 apply accordingly.

Figure 3D:
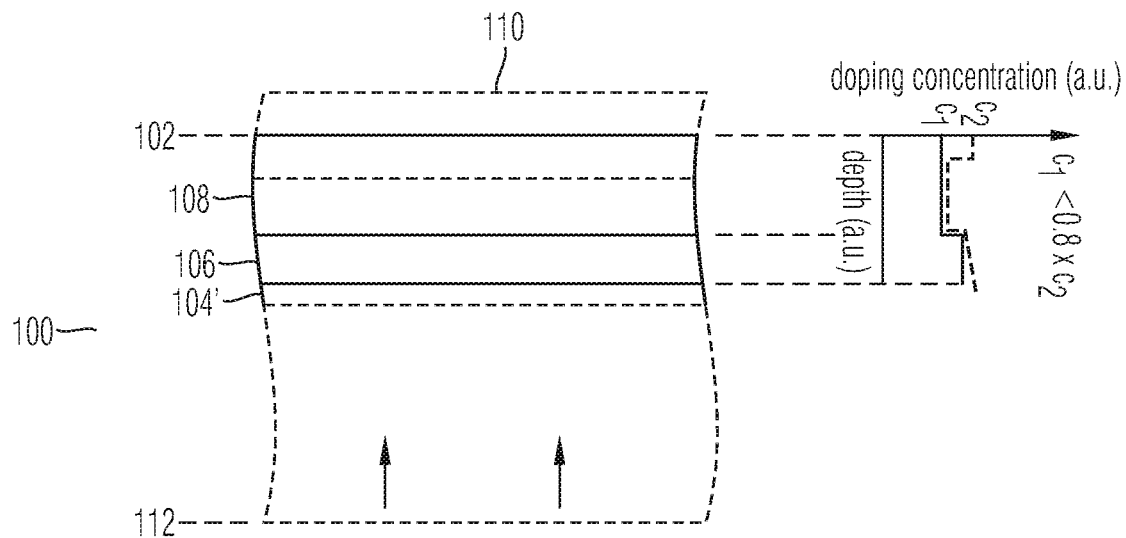
FIG. 3D is a schematic cross-sectional view of the semiconductor body depicted in FIG. 3C after thinning of the semiconductor body at a second surface opposite to the first surface.

The cross-sectional view of FIG. 3D illustrates an example of thinning the semiconductor body by removing material of the semiconductor substrate from a second surface 112 of the semiconductor body 100 opposite to the first surface 102. Material removal may be carried out by using mechanical material removal, for example lapping and polishing, chemical etching, plasma etching or laser ablation. Further details provided herein with reference to process feature S130 illustrated in FIG. 1 apply accordingly. In one or more embodiments, the semiconductor substrate 104 is completely removed. In some other embodiments, a part 104' of the semiconductor substrate 104 may remain after thinning.

Figure 3E:
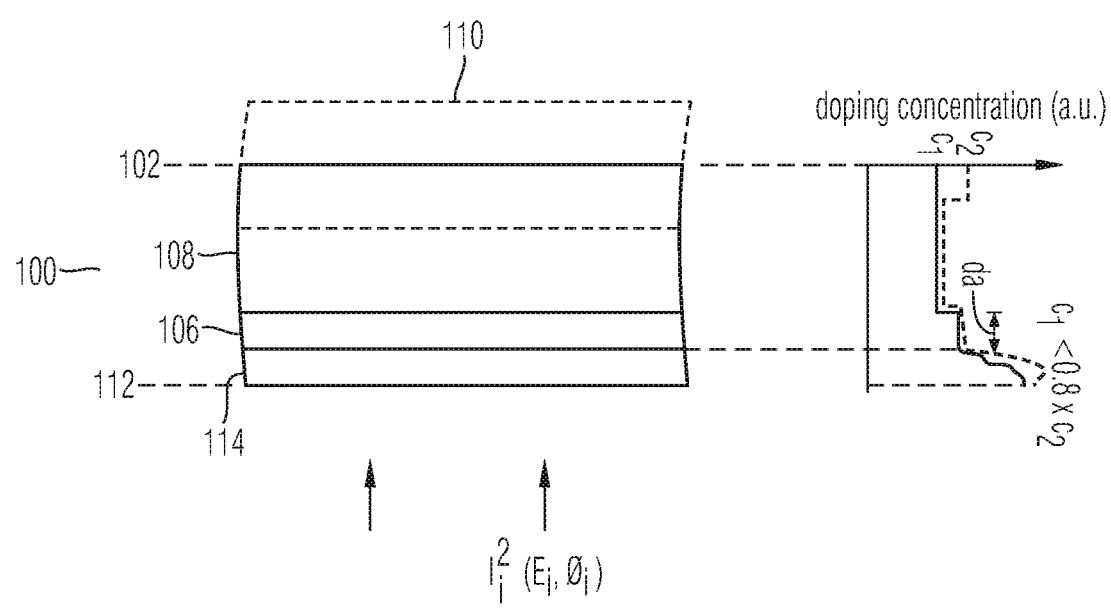
FIG. 3E is a schematic cross-sectional view of the semiconductor body depicted in FIG. 3D after forming a second field stop zone portion by proton implantation or by doping with deep-level dopants and annealing.

The cross-sectional view of FIG. 3E illustrates an example of forming a second field stop zone portion 114 of the first conductivity type by implanting protons at one or more energies $E_i$ into the semiconductor body 100 through the second surface 112. A deepest end-of-range peak of the protons is set in the first field stop zone portion 106 at a vertical distance da to a transition between the drift zone 108 and the first field stop zone portion 106 in a range from 3 μm to 60 μm. Proton implantation may be replaced by introduction of deep-level dopants, for example selenium by ion implantation and/or diffusion, thereby fabricating the second field stop zone portion 114 by deep-level dopants. Referring to the cross-sectional view of FIG. 3E, the semiconductor body 100 is further annealed by thermal processing, thereby activating hydrogen related donors or deep-level dopants as is illustrated in the right part of FIG. 3E. Thus, a lower part of the first field stop zone portion 106 becomes the second field stop zone portion 114. Further details provided herein with reference to process features S140, S150 illustrated in FIG. 1, for example as regards the charges q1, q2 associated with first and second field stop zone portions 106, 114, or doses $\Theta_i$, energies Ei, number n of implantations $I^2_i$ or a gradient α of a doping concentration profile in the second field stop zone portion 114 apply accordingly.

FIGS. 4A to 4E are cross-sectional views of a semiconductor body for illustrating examples of process features.

Figure 4A:
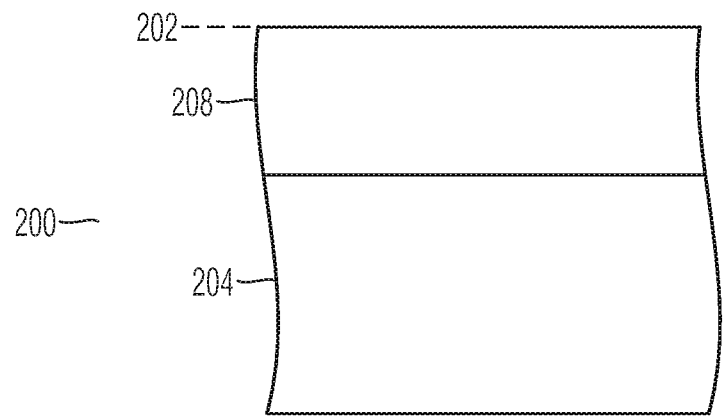
FIG. 4A is a schematic cross-sectional view of a semiconductor body for illustrating a process of manufacturing a semiconductor device by forming a drift zone.

The cross-sectional view of FIG. 4A illustrates an example of the process feature of forming a drift zone 208 of a first conductivity type on a semiconductor substrate 204. Further details provided with reference to process feature S200 illustrated in FIG. 2 apply accordingly.

Figure 4B:
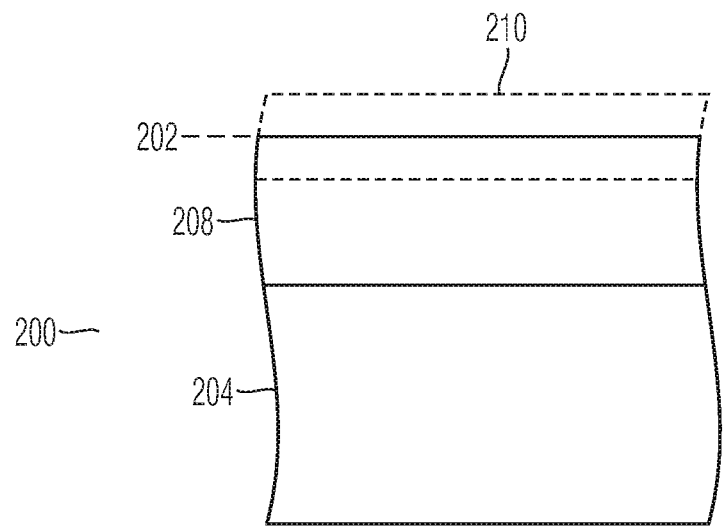
FIG. 4B is a schematic cross-sectional view of the semiconductor body depicted in FIG. 4A after processing the semiconductor body at a first surface of the semiconductor body.

The cross-sectional view of FIG. 4B illustrates an example of the process feature of processing the semiconductor body 200 at the first surface 202, resulting in a processed portion 210 that may include a part of the semiconductor body 200 adjoining the first surface 202 as well as a wiring area over the semiconductor body 200 at the first surface 202. Further details provided with reference to process feature S210 illustrated in FIG. 2 apply accordingly.

Figure 4C:
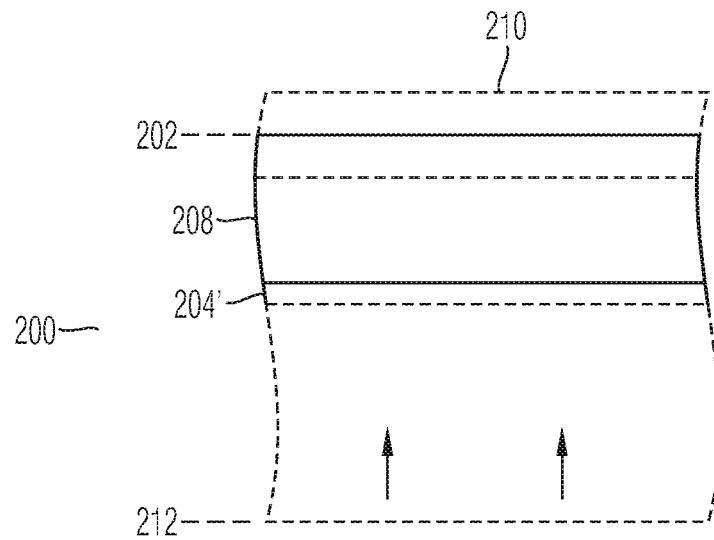
FIG. 4C is a schematic cross-sectional view of the semiconductor body depicted in FIG. 4B after thinning of the semiconductor body at a second surface opposite to the first surface.

The cross-sectional view of FIG. 4C illustrates an example of thinning the semiconductor body by removing material of the semiconductor substrate from a second surface of the semiconductor body 200 opposite to the first surface 202. Material removal may be carried out by using mechanical material removal, for example lapping and polishing, chemical etching, plasma etching or laser ablation. Further details provided herein with reference to process feature S220 illustrated in FIG. 2 apply accordingly. In one or more embodiments, the semiconductor substrate 204 is completely removed. In some other embodiments, a part 204' of the semiconductor substrate 204 may remain after thinning.

Figure 4D:
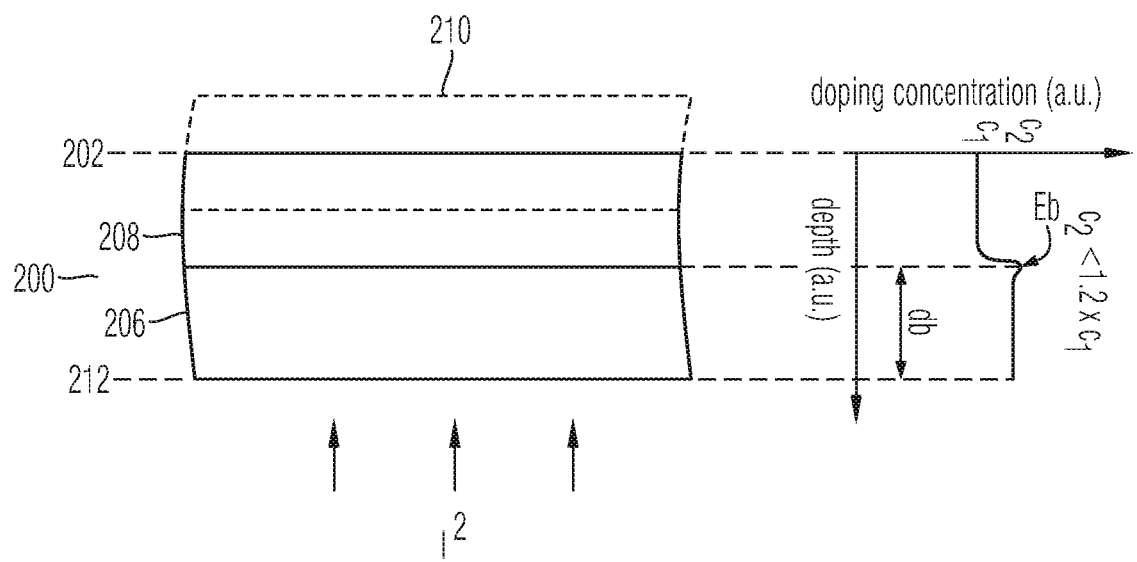
FIG. 4D is a schematic cross-sectional view of the semiconductor body depicted in FIG. 4C after forming a first field stop zone portion between the second surface and the drift zone.

The cross-sectional view of FIG. 4D illustrates an example of forming a first field stop zone portion 206 of the first conductivity type between the second surface 212 and the drift zone by implanting protons into the semiconductor body 200 through the second surface 212 and setting a vertical distance db between an end-of-range peak Eb of the protons and the second surface 212 in a range from 5 μm to 70 μm. Moreover, an average doping concentration of the first field stop zone portion 206 is set greater than 120% of an average doping concentration of the drift zone. Further details provided with reference to process feature S230 illustrated in FIG. 2 apply accordingly. An exemplary doping profile in the drift zone 208 and in the first field stop zone portion 206 is illustrated in the right part of FIG. 4D, for example a constant doping concentration c1 in the drift zone 208 and an almost constant doping concentration with an average doping concentration c2 in the first field stop zone portion 206. Thus, a lower part of the drift zone 208 becomes the first field stop zone portion 206.

Figure 4E:
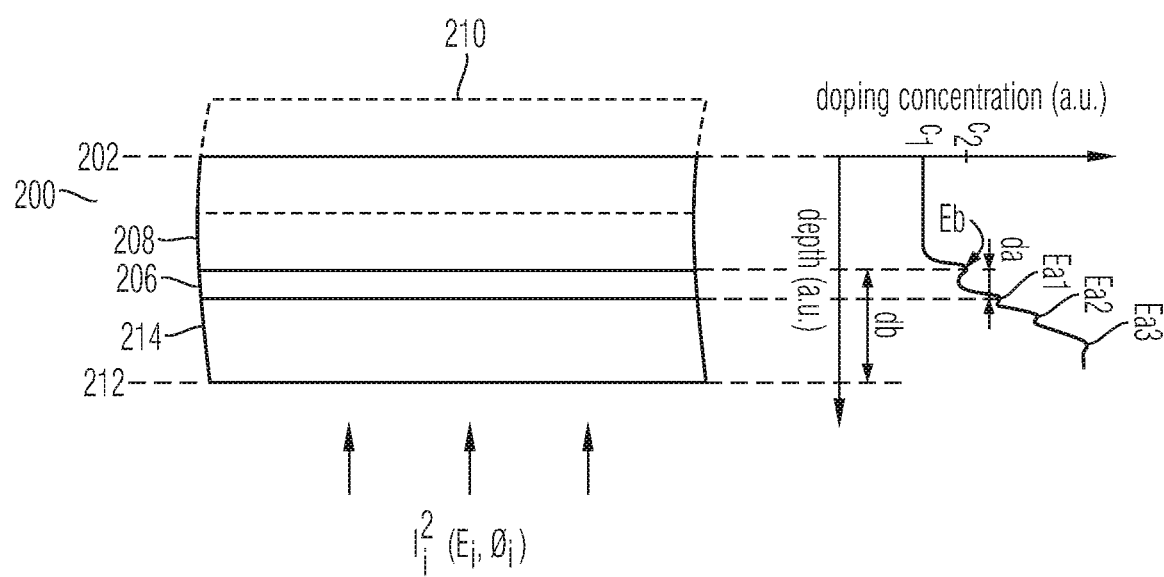
FIG. 4E is a schematic cross-sectional view of the semiconductor body depicted in FIG. 4D after forming a second field stop zone portion by proton implantation or by doping with deep-level dopants and annealing.

The cross-sectional view of FIG. 4E illustrates an example of forming a second field stop zone portion 214 of the first conductivity type by implanting protons at one or more energies $E_i$ into the semiconductor body 200 through the second surface 212. A deepest end-of-range peak Ea1 of the protons is set in the first field stop zone portion 206 at a vertical distance da to a transition between the drift zone 208 and the first field stop zone portion 206 in a range from 3 μm to 60 μm. Proton implantation may be replaced by introduction of deep-level dopants, for example selenium by ion implantation and/or diffusion, thereby fabricating the second field stop zone portion 114 by deep-level dopants. Referring to the cross-sectional view of FIG. 4E, the semiconductor body 200 is further annealed by thermal processing, thereby activating hydrogen related donors as is illustrated in the right part of FIG. 4E.

Further details provided herein with reference to process features S240, S250 illustrated in FIG. 2, for example as regards the charges q1, q2 associated with first and second field stop zone portions 206, 214, or doses $\Theta_i$, energies Ei, number of implantations $I^2_i$ or a gradient $\alpha$ of a doping concentration profile in the second field stop zone portion 214 apply accordingly.

In one or more embodiments, protons implantation(s) for fabricating the first field stop zone portion 206 and the second field stop zone portion 214 may be annealed in a common annealing process, for example process feature S250 illustrated in FIG. 2 may be used for activating dopants in the first and second field stop zone portions 206, 214. In addition, one or more optional annealing processes may be carried out between process features S240 and S250 of FIG. 2, for example. In one or more embodiments, one or more proton implantations used to fabricate the first field stop zone portion 206 may be carried out after or between some of the proton implantations used to fabricate the second field stop zone portion 214, for example.

FIG. 5 is a schematic cross-sectional view illustrating examples of semiconductor devices that may be fabricated by, for example, including the process features of the methods 1000 and 2000 described above.

In the left encircled part of the processed portion 110, 210, a first load contact L1 of a power diode, for example an anode electrode contact is electrically connected to a $p^+$-doped anode region 325. The $p^+$-doped anode region 325 may be formed when carrying out process features S120 or S210, for example.

In the right encircled part of the processed portion 110, 210, a first load contact L1 of an insulated gate bipolar transistor, for example a source electrode contact is electrically connected to a p-doped body region 326 and to an $n^+$-doped source region 327. Furthermore, a control electrode contact C, for example a gate electrode contact is electrically connected to a gate electrode 328. A gate dielectric 329 is arranged between the gate electrode 328 and the drift zone 108, 208. The first load contact L1, the p-doped body region 326, the $n^+$-doped source region 327, the gate electrode 328, and the gate dielectric 329 may be formed when carrying out process features S120 or S210, for example.

In the left encircled part at the bottom of the semiconductor body 100, 200, a second load contact L2, for example a cathode electrode contact is electrically connected to an $n^+$-doped cathode region 330. The $n^+$-doped cathode region 330 may be formed by a doping process after thinning of the semiconductor body 100, 200 or by layer deposition and doping prior to carrying out process features S100 and S200, for example. The $n^+$-doped cathode region 330 may also be formed partly or completely in the part 104', 204' of the semiconductor substrate 104, 204 that may remain after thinning, for example.

In the right encircled part at the bottom of the semiconductor body 100, 200, a second load contact L2, for example a rear side emitter electrode contact is electrically connected to a $p^+$-doped rear side emitter region 331. The $p^+$-doped rear side emitter region 331 may be formed by a doping process after thinning of the semiconductor body 100, 200 or by layer deposition and doping prior to carrying out process features S100 and S200, for example. The $p^+$-doped rear side emitter region 331 may also be formed partly or completely in the part 104', 204' of the semiconductor substrate 104, 204 that may remain after thinning, for example.

Figure 6:
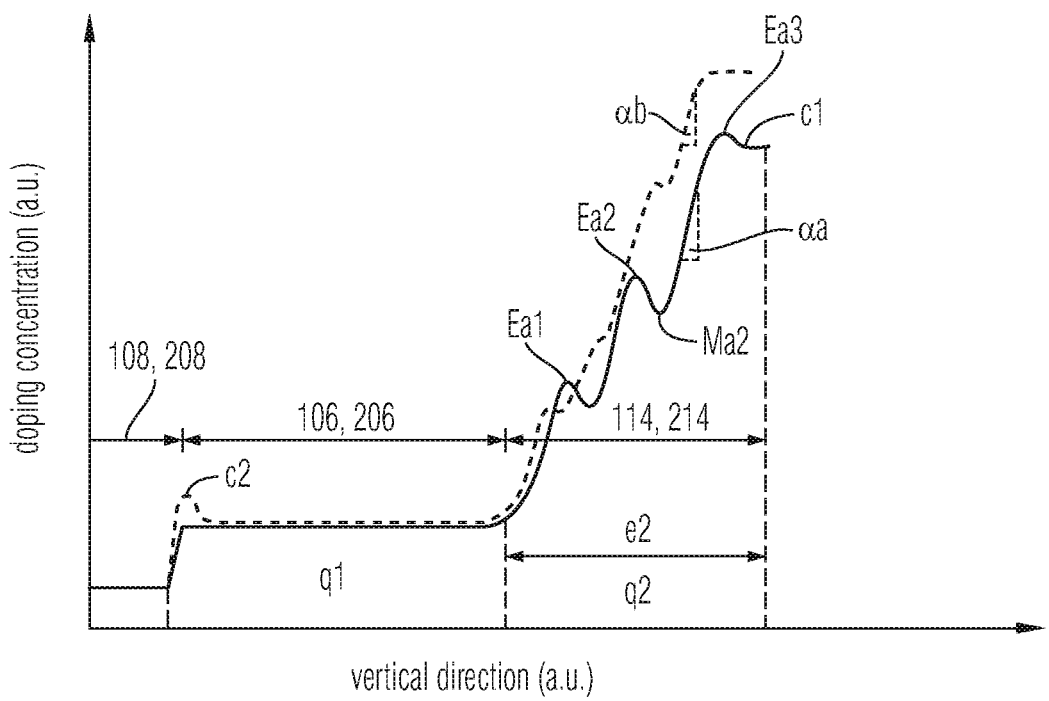
FIG. 6 is a schematic graph illustrating doping concentration profiles along a vertical direction through the first and second field stop zone portions.

FIG. 6 is a schematic graph illustrating examples of profiles of doping concentration c along a vertical direction into a depth of a semiconductor device that may be manufactured by methods 1000 or 2000 described above. A device including a doping concentration as depicted by a first curve c1 may be fabricated by carrying out the process features of the method 1000 including three proton implantations for fabricating the second field stop zone portion 114. A device including a doping concentration as depicted by a second curve c2 may be fabricated by carrying out the process features of the method 2000 including five proton implantations for fabricating the second field stop zone portion 214.

In one or more embodiments, q1 equals an integral of an ionized dopant charge along a vertical extension of the first field stop zone portion 106, 206 and q2 equals an integral of an ionized dopant charge along a vertical extension of the second field stop zone portion 114, 214, and a doping concentration profile of the first and second field stop zone portions 106, 206, 114, 214 is adjusted to set a ratio of q2 to q1 in a range from 1 to 8. In one or more embodiments, q1 is set smaller than a breakdown charge of the semiconductor body, thereby enabling an effective field stop function of the first and second field stop zone portions. In one or more embodiments, q1 is set smaller than 80% of a breakdown charge of the semiconductor body 100, 200.

In one or more embodiments, a maximum gradient aa, ab of the doping concentration profiles c1, c2 in the second field stop zone portion 114, 214 between the absolute maximum of the doping concentration in the second field stop zone portion and the transition between the first and the second field stop zone portion is smaller than $10^{21}$ dopant atoms/$cm^{-4}$, or smaller than $10^{20}$ dopant atoms/$cm^{-4}$. This may allow for improved softness.

In one or more embodiments, a number of doping concentration peaks in the second field stop zone portion 114, 214 is set in a range from 3 to 10.

In one or more embodiments, a vertical extension e2 of the second field stop zone portion 114, 214 is set in a range from 1 μm to 15 μm.

In one or more embodiments, a doping concentration profile of the second field stop zone portion includes a plurality of peaks, and the doping concentration profile is set to decrease, along a vertical direction toward the second surface, from a maximum, for example peak Ea2 illustrated in FIG. 6 to a neighboring minimum, for example minimum Ma2 illustrated in FIG. 6 by less than 50% of a concentration value at the maximum or peak.

In one or more embodiments, a ratio of doping concentration of a peak in the second field stop zone portion 114, 214 and a neighboring peak located closer to the second surface 112, 212, for example a ratio of doping concentration between the peak Ea2 and the peak Ea3 is in a range of 50% and 95%, or in a range of 70% and 95%, or in arrange of 90% to 95%, for example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device in a semiconductor body, the method comprising:
forming a first field stop zone portion of a first conductivity type on a semiconductor substrate;
forming a drift zone of the first conductivity type on the first field stop zone portion, wherein an average doping concentration of the drift zone is set smaller than 80% of an average doping concentration of the first field stop zone portion;

processing the semiconductor body at a first surface of the semiconductor body;

thinning the semiconductor body by removing material of the semiconductor substrate from a second surface of the semiconductor body opposite to the first surface;

forming a second field stop zone portion of the first conductivity type by implanting protons at one or more energies into the semiconductor body through the second surface, wherein a deepest end-of-range peak of the protons is set in the first field stop zone portion at a vertical distance to a transition between the drift zone and the first field stop zone portion in a range from 3 μm to 60 μm; and annealing the semiconductor body by thermal processing, wherein the protons of the second field stop zone portion are implanted at at least three different ion implantation energies.

2. The method of claim 1, wherein the thinning of the semiconductor body is terminated at a vertical distance to the transition between the drift zone and the first field stop zone portion in a range from 5 μm to 70 μm.

3. The method of claim 1, wherein the first field stop zone portion and the drift zone are formed by an epitaxial layer formation process.

4. A method of manufacturing a semiconductor device in a semiconductor body, the method comprising:

forming a drift zone of a first conductivity type on a semiconductor substrate;

processing the semiconductor body at a first surface of the semiconductor body;

thinning the semiconductor body by removing material of the semiconductor substrate from a second surface of the semiconductor body opposite to the first surface;

forming a first field stop zone portion of the first conductivity type between the second surface and the drift zone by implanting protons into the semiconductor body through the second surface and setting a vertical distance between an end-of-range peak of the protons and the second surface in a range from 5 μm to 70 μm, and further setting an average doping concentration of the first field stop zone portion greater than 120% of an average doping concentration of the drift zone;

forming a second field stop zone portion of the first conductivity type by implanting protons at one or more energies into the semiconductor body through the second surface, wherein a deepest end-of-range peak of the protons is set in the first field stop zone portion at a vertical distance to a transition between the drift zone and the first field stop zone portion in a range from 3 μm to 60 μm; and annealing the semiconductor body by thermal processing wherein q1 equals an integral of an ionized dopant charge along a vertical extension of the first field stop zone portion and q2 equals an integral of an ionized dopant charge along a vertical extension of the second field stop zone portion, and wherein a doping concentration profile of the first and second field stop zone portions is adjusted to set a ratio of q2 to q1 in a range from 1 to 8.

5. The method of claim 4, wherein a ratio of an ion implantation energy of the protons of the first field stop zone portion to an ion implantation energy of the protons associated with the deepest end-of-range peak of the second field stop zone portion is set in a range from 2 to 50.

6. The method of claim 4, wherein a vertical extension of the second field stop zone portion is set in a range from 1 μm to 15 μm.

7. The method of claim 4, wherein the protons of the second field stop zone portion are implanted at three to ten different ion implantation energies ranging from 200 keV to 700 keV.

8. The method of claim 7, wherein a ratio of a smallest ion implantation energy to a largest ion implantation energy among the three to ten different ion implantation energies is set in a range from 50% to 90%.

9. The method of claim 7, wherein an ion implantation dose of proton implantation is set smaller with increasing ion implantation energy among the three to ten different ion implantation energies.

10. The method of claim 7, wherein an ion implantation dose associated with one of the three to ten different ion implantation energies is set between 3% and 70% of an ion implantation dose associated with another one of the three to ten different implantation energies that is a next larger ion implantation energy to the one of the three to ten different ion implantation energies.

11. The method of claim 4, wherein annealing temperatures of the thermal processing are set in a range from 360° C. to 440° C. and a duration of the thermal processing is set in a range from 30 minutes to 2 hours.

12. The method of claim 4, wherein an implantation dose of the protons of the second field stop zone portion is set in a range from $1 \times 10^{13}$ cm$^{-2}$ to $5 \times 10^{15}$ cm$^{-2}$.

13. The method of claim 4, wherein a doping concentration of the drift zone is set in a range from $5 \times 10^{12}$ cm$^{-3}$ to $5 \times 10^{14}$ cm$^{-3}$.

14. The method of claim 4, wherein a gradient of a dopant concentration profile of the second field stop zone portion is set smaller than $1 \times 10^{21}$ cm$^{-4}$.

15. The method of claim 4, wherein q1 is set smaller than a breakdown charge of the semiconductor body.

16. The method of claim 4, wherein q1 is set smaller than 60% of a breakdown charge of the semiconductor body.

17. The method of claim 4, wherein the semiconductor device is a diode, and wherein processing the semiconductor body at the first surface comprises forming a p-doped anode region in the semiconductor body at the first surface.

18. The method of claim 4, wherein the semiconductor device is a transistor, and wherein processing the semiconductor body at the first surface comprises forming a source region and a gate electrode structure at the first surface.

19. The method of claim 4, wherein a doping concentration profile of the second field stop zone portion includes a plurality of peaks, and wherein the doping concentration profile is set to decrease, along a vertical direction toward the second surface, from a maximum to a neighboring minimum by less than 50% of a concentration value at the maximum.

20. The method of claim 4, further comprising introducing dopants of the first conductivity type into the semiconductor body through the second surface, wherein the dopants are deep-level dopants.

21. A method of manufacturing a semiconductor device in a semiconductor body, the method comprising:

forming a first field stop zone portion of a first conductivity type on a semiconductor substrate;

forming a drift zone of the first conductivity type on the first field stop zone portion, wherein an average doping concentration of the drift zone is set smaller than 80% of an average doping concentration of the first field stop zone portion;

processing the semiconductor body at a first surface of the semiconductor body;

thinning the semiconductor body by removing material of the semiconductor substrate from a second surface of the semiconductor body opposite to the first surface;

forming a second field stop zone portion of the first conductivity type by introducing dopants of the first conductivity type into the semiconductor body through the second surface, wherein the dopants are deep-level dopants; and annealing the semiconductor body by thermal processing, wherein the second field stop zone portion is formed by introducing the dopants of the first conductivity type into the semiconductor body through the second surface after the thinning of the semiconductor body.

22. The method of claim 21, wherein the dopants are selenium dopants.

23. A method of manufacturing a semiconductor device in a semiconductor body, the method comprising:

forming a drift zone of a first conductivity type on a semiconductor substrate;

processing the semiconductor body at a first surface of the semiconductor body;

thinning the semiconductor body by removing material of the semiconductor substrate from a second surface of the semiconductor body opposite to the first surface;

forming a first field stop zone portion of the first conductivity type between the second surface and the drift zone by implanting protons into the semiconductor body through the second surface and setting a vertical distance between an end-of-range peak of the protons and the second surface in a range from 5 μm to 70 μm and further setting an average doping concentration of the first field stop zone portion greater than 120% of an average doping concentration of the drift zone;

forming a second field stop zone portion of the first conductivity type by introducing dopants of the first conductivity type into the semiconductor body through the second surface, wherein the dopants are deep-level dopants; and annealing the semiconductor body by thermal processing wherein after the annealing, a doping concentration profile of the second field stop zone portion comprises a plurality of local maximums wherein the doping concentration decreases on either side the respective local maximum.

24. The method of claim 23, wherein the dopants are selenium dopants.

* * * * *

UNITED STATES PATENT AND TRADEMARK OFFICE
CERTIFICATE OF CORRECTION

PATENT NO. : 11,081,544 B2
APPLICATION NO. : 16/202752
DATED : August 3, 2021
INVENTOR(S) : Schulze et al.

Page 1 of 1

It is certified that error appears in the above-identified patent and that said Letters Patent is hereby corrected as shown below:

In the Claims

Column 15, Line 54 (Claim 4), please change "processing" to -- processing, --.

Signed and Sealed this
Nineteenth Day of October, 2021

Drew Hirshfeld
*Performing the Functions and Duties of the*
*Under Secretary of Commerce for Intellectual Property and*
*Director of the United States Patent and Trademark Office*